(12) United States Patent
Yeh et al.

(10) Patent No.: US 11,694,941 B2
(45) Date of Patent: Jul. 4, 2023

(54) SEMICONDUCTOR DIE PACKAGE WITH MULTI-LID STRUCTURES AND METHOD FOR FORMING THE SAME

(71) Applicant: Taiwan Semiconductor Manufacturing Company, Ltd., Hsinchu (TW)

(72) Inventors: Shu-Shen Yeh, Taoyuan (TW); Che-Chia Yang, Taipei (TW); Chia-Kuei Hsu, Hsinchu (TW); Ming-Chih Yew, Hsinchu (TW); Po-Yao Lin, Zhudong Township, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 34 days.

(21) Appl. No.: 17/318,163

(22) Filed: May 12, 2021

(65) Prior Publication Data

US 2022/0367314 A1    Nov. 17, 2022

(51) Int. Cl.
*H01L 23/373*    (2006.01)
*H01L 23/29*    (2006.01)
*H01L 23/58*    (2006.01)

(52) U.S. Cl.
CPC ............ *H01L 23/373* (2013.01); *H01L 23/29* (2013.01); *H01L 23/585* (2013.01)

(58) Field of Classification Search
CPC ...... H01L 23/373; H01L 23/29; H01L 23/585
See application file for complete search history.

(56) References Cited

U.S. PATENT DOCUMENTS 6,809,421 B1 * 10/2004 Hayasaka .............. H01L 25/50
257/621
8,993,380 B2    3/2015 Hou et al.
(Continued)

FOREIGN PATENT DOCUMENTS

TW    201834086 A    9/2018
TW    201843806 A    12/2018

OTHER PUBLICATIONS

Chinese language office action dated Aug. 15, 2022, issued in application No. TW 111103062.

*Primary Examiner* — Peniel M Gumedzoe
(74) *Attorney, Agent, or Firm* — McClure, Qualey & Rodack, LLP

(57) ABSTRACT

A semiconductor die package and a method of forming the same are provided. The semiconductor die package includes a package substrate, an interposer substrate over the package substrate, semiconductor dies over the interposer substrate, and an underfill element over the interposer substrate and between the semiconductor dies and interposer substrate. The semiconductor die package also includes a ring structure and one or more lid structures separated from the ring structure. The ring structure is coupled to the package substrate to control warpage. The lid structures are coupled to the top surfaces of the semiconductor dies to control warpage and help heat dissipation. In addition, the lid structures define a gap to allow a portion of the underfill element between the adjacent semiconductor dies to be exposed, so that stress concentration on that portion can be avoided or reduced. Accordingly, the reliability of the semiconductor die package is improved.

20 Claims, 13 Drawing Sheets

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 9,805,997 B2 | 10/2017 | Liu et al. |
| 10,573,579 B2 | 2/2020 | Chen et al. |
| 11,417,580 B2 | 8/2022 | Yu et al. |
| 2014/0217575 A1* | 8/2014 | Hung .................. H01L 23/373 257/713 |
| 2017/0162542 A1* | 6/2017 | Chen .................. H01L 23/367 |
| 2018/0204807 A1* | 7/2018 | Aizawa ............... H01L 23/5383 |
| 2019/0115269 A1* | 4/2019 | Pan ........................ H01L 25/18 |
| 2019/0279919 A1 | 9/2019 | Xu et al. |
| 2020/0203186 A1 | 6/2020 | Huang et al. |

\* cited by examiner

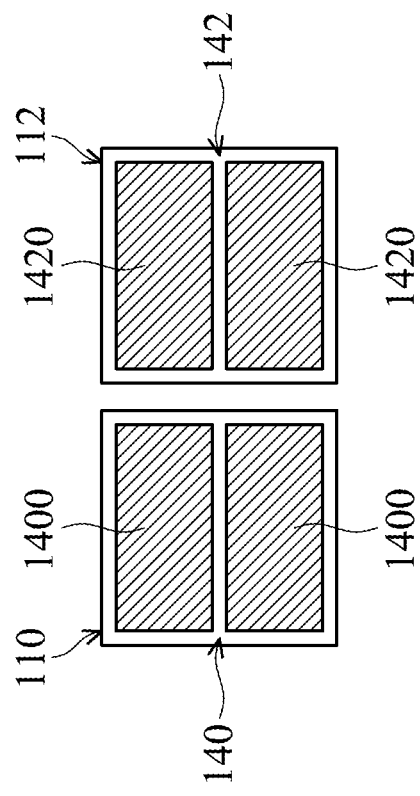
FIG. 3A
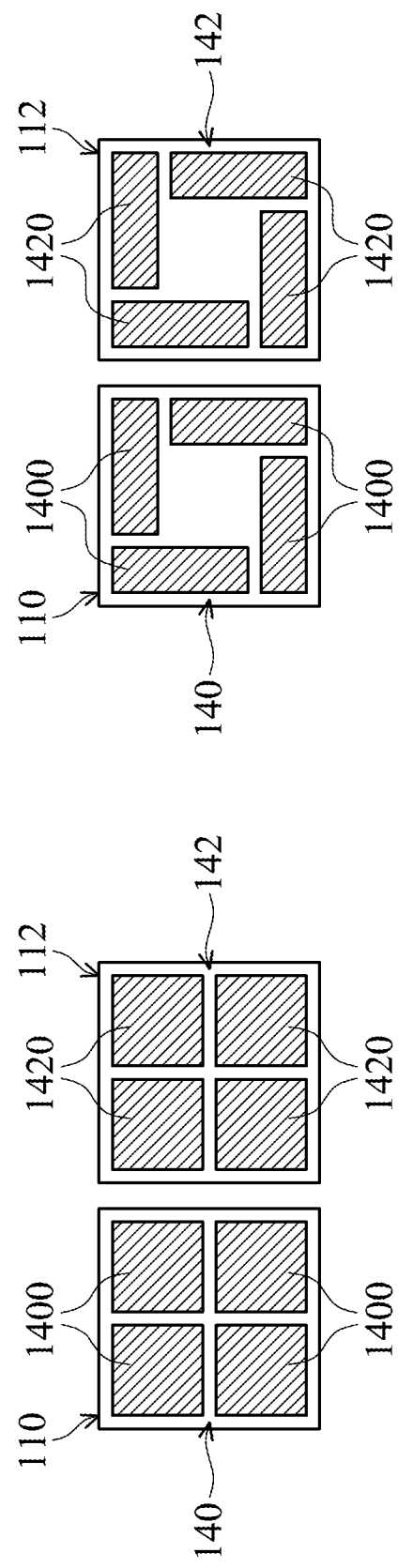
FIG. 3B
FIG. 3C

SEMICONDUCTOR DIE PACKAGE WITH MULTI-LID STRUCTURES AND METHOD FOR FORMING THE SAME

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers over a semiconductor substrate, and patterning the various material layers using lithography and etching processes to form circuit components and elements thereon. Many integrated circuits (ICs) are typically manufactured on a single semiconductor wafer, and individual dies on the wafer are singulated by sawing between the integrated circuits along a scribe line. The individual dies are typically packaged separately, in multi-chip modules, for example, or in other types of packaging.

One smaller type of packaging for semiconductors is a flip chip chip-scale package (FcCSP), in which a semiconductor die is placed upside-down on a package substrate and bonded to the package substrate using conductive bumps. An underfill element is generally applied into the gaps formed by the conductive bumps in order to secure the semiconductor die to the package substrate. The substrate has wiring routed to connect the bumps on the semiconductor die to contact pads on the package substrate that have a larger footprint. An array of solder balls is formed on the opposite side of the package substrate and is used to electrically connect the packaged semiconductor die to an end application.

Although existing packaging structures and methods for fabricating package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1F-1 is a schematic cross-sectional view of a semiconductor die package in accordance with some embodiments, wherein each packaged semiconductor die is a System on a Chip (SoC).

FIG. 1F-2 is a schematic cross-sectional view of a semiconductor die package in accordance with some embodiments, wherein the lid structures have different thicknesses.

FIG. 2 is a schematic plan view of a semiconductor die package in accordance with some embodiments, and FIG. 1E is a schematic cross-sectional view of the semiconductor die package taken along a line A-A' in FIG. 2.

FIG. 3A is a schematic plan view showing the lid structures each including a plurality of lid parts in accordance with some embodiments.

FIG. 3B is a schematic plan view showing the lid structures each including a plurality of lid parts in accordance with some embodiments.

FIG. 3C is a schematic plan view showing the lid structures each including a plurality of lid parts in accordance with some embodiments.

DETAILED DESCRIPTION

Figure 1A:
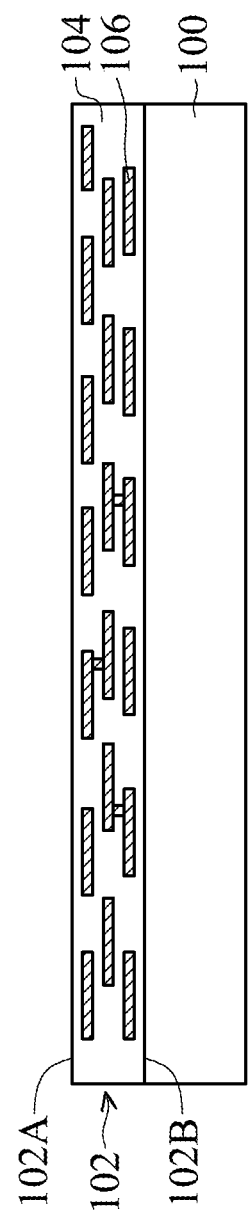
FIGS. 1A-1F are schematic cross-sectional views of various stages of a process for forming a semiconductor die package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

A semiconductor die package and the method for forming the same are provided in accordance with various embodiments. Some variations of some embodiments are discussed. Throughout the various views and illustrative embodiments, like reference numbers are used to designate like elements. In accordance with some embodiments of the present disclosure, a semiconductor die package includes multi-lid structures for controlling warpage and for reducing stress concentrated on a portion of an underfill element between adjacent semiconductor dies. Some rigid lid structures (or parts) are coupled to a package substrate, and some other rigid lid structures (or parts) are respectively attached to top surfaces of semiconductor dies over the package substrate, while exposing a portion of the underfill element between adjacent semiconductor dies. Accordingly, the warpage on the package substrate and semiconductor dies can be reduced, and the stress concentration, as well as the risk of cracks or delamination, on the portion of the underfill element between adjacent semiconductor dies is also reduced, which will be further described later.

Embodiments will be described with respect to a specific context, namely a packaging technique with an interposer substrate or other active chip in a two and a half dimensional integrated circuit (2.5DIC) structure or a three dimensional IC (3DIC) structure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order.

Figure 4:
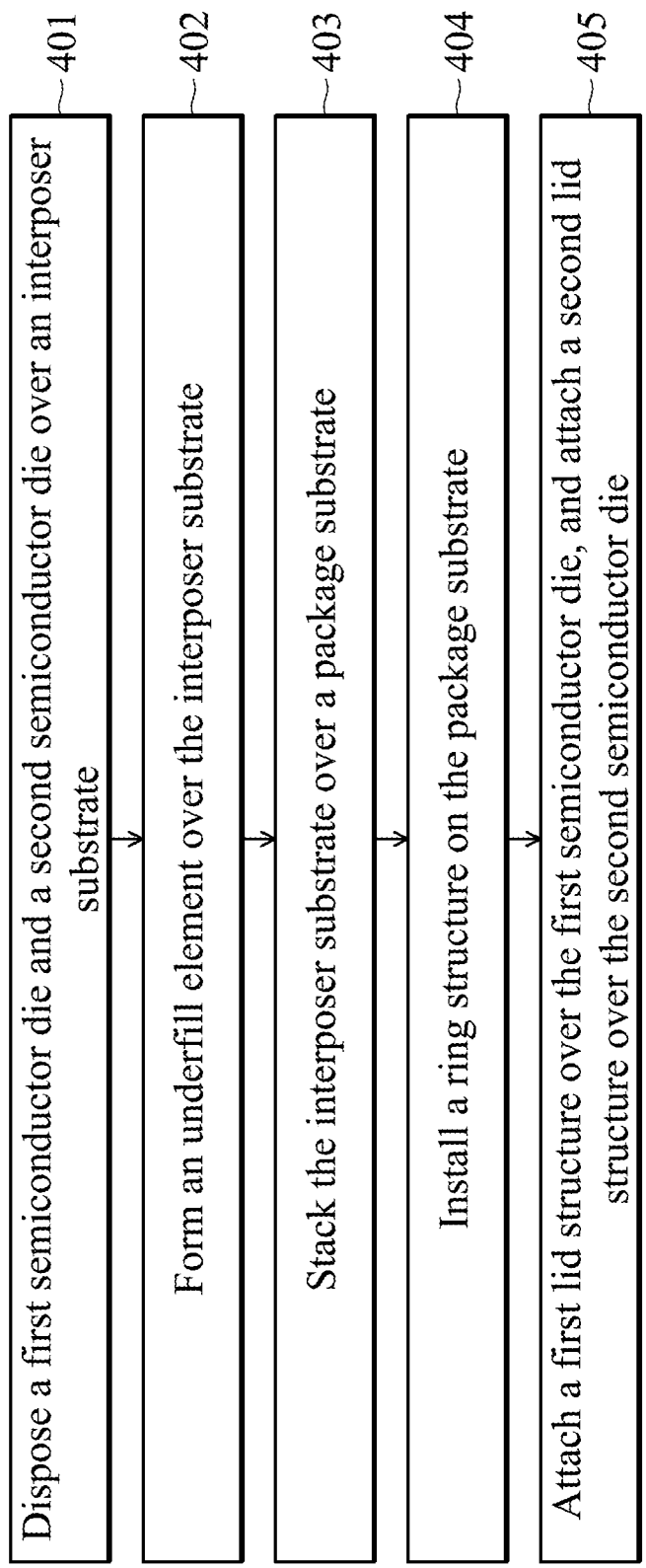
FIG. 4 illustrates a process flow for forming a semiconductor die package in accordance with some embodiments.

FIGS. 1A-1F illustrate cross-sectional views of intermediate stages in the formation of a semiconductor die package in accordance with some embodiments of the present disclosure. The corresponding processes are also reflected schematically in the process flow shown in FIG. 4.

As shown in FIG. 1A, an interposer substrate 102 is formed over a carrier substrate 100, in accordance with some embodiments. The carrier substrate 100 is used to provide temporary mechanical and structural support for the processing of build-up layers or structures during subsequent processing steps. The carrier substrate 100 may be a glass substrate, semiconductor substrate, or another suitable substrate. The interposer substrate 102 is used to provide electrical connection between semiconductor devices (which will be described later) packaged in the package structure and a package substrate (which will be described later), after the carrier substrate 100 is removed at a subsequent stage illustrated in FIG. 1D.

In some embodiments, the interposer substrate 102 is an interposer wafer, which is free from active devices (such as transistors and diodes) and passive devices (such as resistors, capacitors, inductors, or the like). In some alternative embodiments, the interposer substrate 102 is a device wafer including active and/or passive devices thereon or therein. In some embodiments, the interposer substrate 102 may be a dielectric substrate, which includes a redistribution layer (RDL) structure. As shown in FIG. 1A, the RDL structure includes multiple laminated insulating layers 104 and multiple conductive features 106 surrounded by the insulating layers 104. The conductive features 106 may include conductive lines, conductive vias, and/or conductive pads. In some embodiments, some of the conductive vias are stacked with each other. The upper conductive via is substantially aligned with the lower conductive via so as to have a shorter routing length. However, some of the conductive vias may be staggered vias in some cases with restricted routing. The upper conductive via is misaligned with the lower conductive via.

The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104.

In some other embodiments, some or all of the insulating layers 104 are made of or include dielectric materials other than polymer materials. The dielectric material may include silicon oxide, silicon carbide, silicon nitride, silicon oxynitride, one or more other suitable materials, or a combination thereof.

The conductive features 106 may include conductive lines providing electrical connection in horizontal directions and conductive vias providing electrical connection in vertical directions. The conductive features 106 may be made of or include copper, aluminum, gold, cobalt, titanium, nickel, silver, graphene, one or more other suitable conductive materials, or a combination thereof. In some embodiments, the conductive features 106 include multiple sub-layers. For example, each of the conductive features 106 contains multiple sub-layers including Ti/Cu, Ti/Ni/Cu, Ti/Cu/Ti, Al/Ti/Ni/Ag, other suitable sub-layers, or a combination thereof.

The formation of the RDL structure (of interposer substrate 102) may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

In some alternative embodiments (not shown), the interposer substrate 102 may be a semiconductor substrate, which may be a bulk semiconductor substrate, a silicon-on-insulator (SOI) substrate, a multi-layered semiconductor substrate, or the like. The semiconductor material of the interposer substrate 102 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The interposer substrate 102 may be doped or undoped.

In some embodiments, several through-vias (TVs) are formed in and penetrating through the above semiconductor substrate, in order to provide electrical connection between devices mounted on opposite sides of the interposer substrate 102. The processes for forming the through-vias are well known in the art and therefore not described herein. In some further embodiments, one or more interconnect structure layers (similar to the RDL structure of interposer substrate 102 shown in FIG. 1A) may be formed on one or both sides of the semiconductor substrate of interposer substrate 102 to facilitate routing.

Figure 1B:
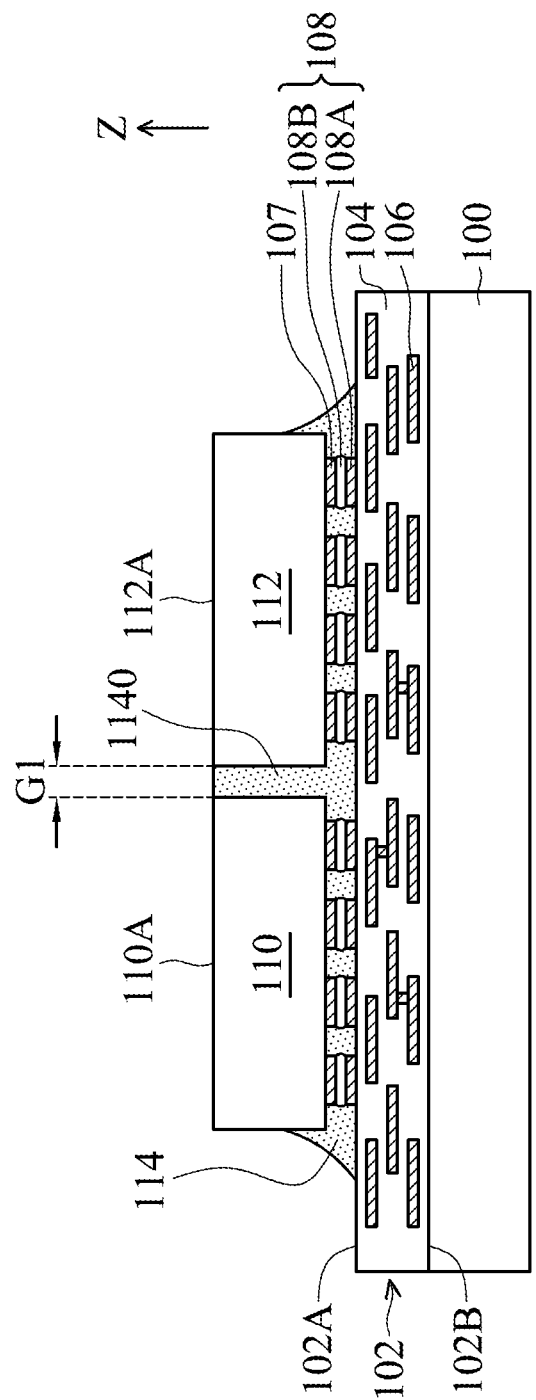

As shown in FIG. 1B, several semiconductor dies 110 and semiconductor dies 112 (for illustration, only one semiconductor die 110 and one semiconductor die 112 are shown) are disposed over the interposer substrate 102, in accordance with some embodiments. The respective process is illustrated as process 401 in the process flow 400 shown in FIG. 4. The semiconductor dies 110 and 112 may be placed over a first side 102A (for example, the upper side) of the interposer substrate 102 using, for example, a pick-and-place tool. In some embodiments, the semiconductor dies 110 and 112 over the interposer substrate 102 are arranged side by side (for example, one semiconductor die 110 is adjacent to one semiconductor die 112) with a gap G1 between adjacent semiconductor dies 110 and 112, as shown in FIG. 1B.

In some embodiments, each of the semiconductor dies 110 and 112 may be an integrated circuit (IC) chip or die, which includes a semiconductor substrate having a plurality of semiconductor devices (e.g., transistors, diodes, passive devices, etc.) thereon to form a functional integrated circuit. The functional integrated circuit may include a processor, logic circuitry, memory, analog circuit, digital circuit, mixed signal circuit, or the like. In some embodiments, each of the semiconductor dies 110 and 112 is a System on a Chip (SoC), which includes a semiconductor substrate C1, a plurality of electric components C2 (such as active components and/or passive components) having different functions disposed on the semiconductor substrate C1, and a protective layer C3 made of molding material (such as an epoxy-based resin) disposed on the semiconductor substrate C1 and surrounding the electric components C2, as shown in FIG. 1F-1. Each of the semiconductor dies 110 and 112 can be obtained, for example, by sawing or dicing a semiconductor wafer (with several IC dies formed thereon) along scribed lines to separate the semiconductor wafer into a plurality of individual semiconductor dies.

In some embodiments, the semiconductor dies 110 (also referred to as first semiconductor dies herein) and the semiconductor dies 112 (also referred to as second semiconductor dies herein) are different types of electronic devices that provide different functions. For example, the semiconductor dies 110 are processor devices, and the semiconductor dies 112 are memory devices in some cases. However, other combinations of the semiconductor dies 110 and 112 may also be used. In some alternative embodiments, the semiconductor dies 110 and 112 are the same type of electronic devices. In various embodiments, the semiconductor dies 110 and 112 may have the same or different heights in a vertical direction (e.g., the direction Z shown in FIG. 1B), and/or the same or different sizes in a horizontal cross section perpendicular to the vertical direction.

In some embodiments, after disposing the semiconductor dies 110 and 112 over the interposer substrate 102, they are bonded to the interposer substrate 102 through flip-chip bonding by way of the conductive elements 107 on each semiconductor die 110/112 and the conductive structures 108 on the interposer substrate 102 to form conductive joints, as shown in FIG. 1B.

In some embodiments, conductive elements 107, such as conductive pillars, may be formed on an active surface (for example, the lower surface shown in FIG. 1B) of each semiconductor die 110/112 at the exposed contact pads (not shown) before the bonding process. The conductive elements 107 may be made of or include copper, aluminum, gold, cobalt, titanium, tin, one or more other suitable materials, or a combination thereof. The conductive elements 107 may be formed using an electroplating process, an electroless plating process, a placement process, a printing process, a physical vapor deposition (PVD) process, a chemical vapor deposition (CVD) process, one or more other applicable processes, or a combination thereof.

In some embodiments, each of the conductive structures 108 may include a metal pillar 108A and a metal cap layer (such as a solder cap) 108B over the metal pillar 108A, as shown in FIG. 1B. The conductive structures 108 including the metal pillars 108A and the metal cap layers 108B are sometimes referred to as micro bumps. The conductive structures 108 may be formed on the first side 102A of the interposer substrate 102 at the exposed contact pads (not shown) before the bonding process. The metal pillars 108A may include a conductive material such as copper, aluminum, gold, nickel, palladium, the like, or a combination thereof, and may be formed by sputtering, printing, electroplating, electroless plating, CVD, or the like. The metal pillars 108A may be solder-free and have substantially vertical sidewalls. In accordance with some embodiments, a metal cap layer 108B is formed on the top of a metal pillar 108A. The metal cap layers 108B may include nickel, tin, tin-lead, gold, copper, silver, palladium, indium, nickel-palladium-gold, nickel-gold, the like, or a combination thereof, and may be formed by a plating process such as an electroplating process. One of ordinary skill in the art would appreciate that the above conductive structures 108 examples are provided for illustrative purposes, and other structures of the conductive structures 108 may also be used.

The bonding between the semiconductor dies 110 and 112 and the interposer substrate 102 may be solder bonding or direct metal-to-metal (such as a copper-to-copper) bonding. In some embodiments, the semiconductor dies 110 and 112 are bonded to the interposer substrate 102 through a reflow process. During the reflow, the conductive joints (i.e., the conductive elements 107 and the conductive structures 108) are in contact with the exposed contact pads of the semiconductor dies 110 and 112 and the exposed contact pads (constructed by some conductive features 106) of the interposer substrate 102, respectively, to physically and electrically couple the semiconductor dies 110 and 112 to the interposer substrate 102.

In some embodiments, an underfill element 114 is further formed over the interposer substrate 102 to surround and protect the above conductive joints, and enhances the connection between the semiconductor dies 110 and 112 and the interposer substrate 102, as shown in FIG. 1B. The respective process is illustrated as process 402 in the process flow 400 shown in FIG. 4. The underfill element 114 may be made of or include an insulating material such as an underfill material. The underfill material may include an epoxy, a resin, a filler material, a stress release agent (SRA), an adhesion promoter, another suitable material, or a combination thereof. In some embodiments, an underfill material in liquid state is dispensed into the gap between each semiconductor device 110/112 and the interposer substrate 102 to reinforce the strength of the conductive joints and therefore the overall package structure. After the dispensing, the underfill material is cured to form the underfill element 114.

In the present embodiment, as shown in FIG. 1B (see also FIG. 2), the underfill element 114 fills the whole gap between each semiconductor device 110/112 and the interposer substrate 102. For example, a portion 1140 of the underfill element 114 is in the gap G1 between the adjacent semiconductor devices 110 and 112. Also, the underfill element 114 surrounds the semiconductor dies 110 and 112 (for example, it extend beyond the periphery of the semiconductor dies 110 and 112).

Figure 1C:
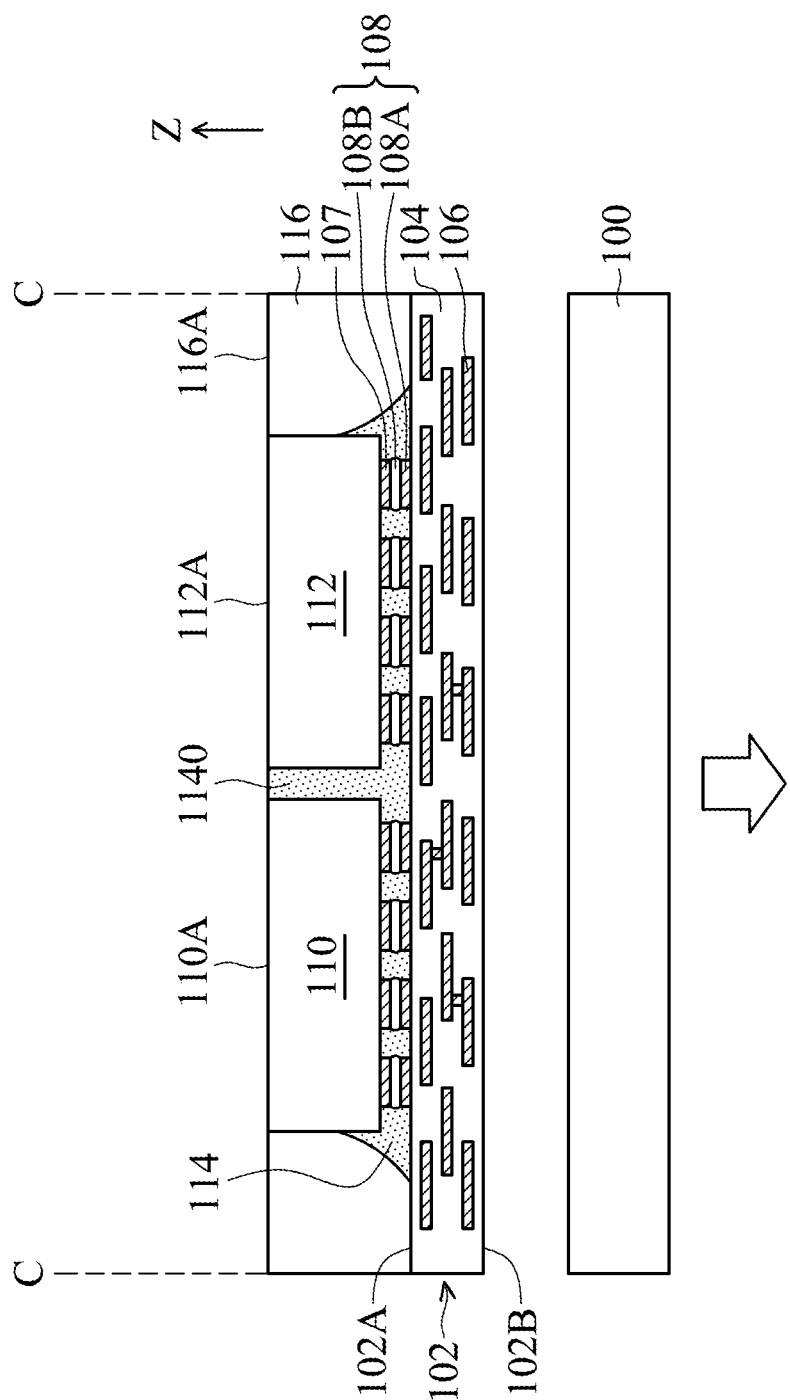

In some embodiments, as shown in FIG. 1C, an encapsulant layer 116 is also formed over the interposer substrate 102 to surround and protect the semiconductor dies 110 and 112 and the underfill element 114. The encapsulant layer 116 may be separated from the conductive joints below the semiconductor dies 110 and 112 by the underfill element 114. In some embodiments, the encapsulant layer 116 is made of or includes an insulating material such as a molding material. The molding material may include a polymer material, such as an epoxy-based resin with fillers dispersed therein. In some embodiments, a molding material (such as a liquid molding material) is dispensed over the interposer substrate 102 and/or over the semiconductor devices 110 and 112. In some embodiments, a thermal process is then used to cure the liquid molding material and to transform it into the encapsulant layer 116.

In some embodiments, a planarization process is applied on the encapsulant layer 116 to partially remove the encapsulant layer 116, until the top surface 110A of each (first) semiconductor die 110 and the top surface 112A of each (second) semiconductor die 112 are exposed from the encapsulant layer 116 (e.g., the top surfaces 110A and 112A are substantially flush with the top surface 116A of the encapsulant layer 116), as shown in FIG. 1C. This facilitates the dissipation of heat generated from the semiconductor devices 110 and 112 during operation. The planarization process may include a grinding process, a chemical mechanical polishing (CMP) process, an etching process, a dry polishing process, one or more other applicable processes, or a combination thereof.

Afterwards, as shown in FIG. 1C, the carrier substrate 100 is removed to expose a second side 102B (for example, the lower side) of the interposer substrate 102, in accordance with some embodiments. Although not shown, the remaining structure can be turned upside down and placed so that the semiconductor device side is affixed to a dicing tape (not shown). Afterwards, a singulation process (also referred to as a saw process) is performed along cutting grooves C shown in FIG. 1C, to form multiple separate package structures, in accordance with some embodiments. In FIG. 1C, one of the package structures is shown, which includes an interposer substrate 102 with semiconductor devices 110 and 112, an underfill element 114 and an encapsulant layer 116 thereon. Afterwards, each package structure may be removed from the dicing tape (not shown) using, for example, a pick-and-place tool (not shown).

Figure 1D:
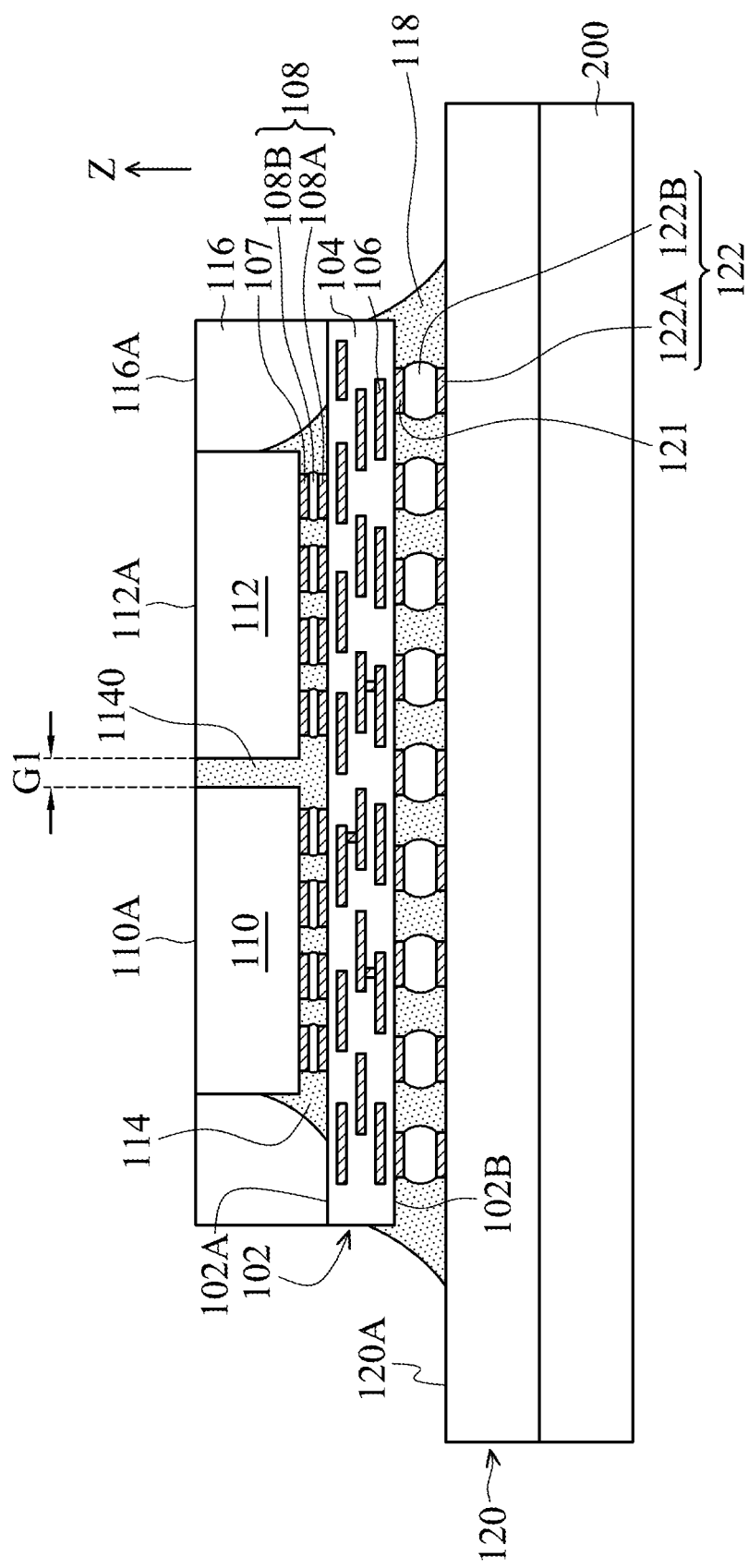

As shown in FIG. 1D, the resulting package structure in FIG. 1C is disposed or stacked (by a pick-and-place tool, for example) over a package substrate 120 placed on a carrier substrate 200 (similar to the carrier substrate 100 mentioned above) with the second side 102B of the interposer substrate 102 facing a first surface 120A (for example, the upper surface) of the package substrate 120, in accordance with some embodiments. The respective process is illustrated as process 403 in the process flow 400 shown in FIG. 4. The package substrate 120 may be used to provide electrical connection between semiconductor devices packaged in the package structure and an external electronic device, after the carrier substrate 200 is removed at a subsequent stage (illustrated in FIG. 1F) which will be further described later. The package substrate 120 may include a core or may be a core-less substrate. In some embodiments, the package substrate 120 may be a printed circuit board (PCB), a ceramic substrate, or another suitable package substrate.

In some embodiments, after stacking the interposer substrate 102 over the package substrate 120, it is bonded to the package substrate 120 through flip-chip bonding by way of the conductive elements 121 (such as conductive pillars) formed on the second side 102B of the interposer substrate 102 at the exposed contact pads (not shown) and the conductive structures 122 (such as micro bumps each including a metal pillar 122A and a metal cap layer 122B over the metal pillar 122A) formed on the first surface 120A of the package substrate 120 at the exposed contact pads (not shown) to form conductive joints, as shown in FIG. 1D. The bonding between the interposer substrate 102 and the package substrate 120 may be solder bonding or direct metal-to-metal (such as a copper-to-copper) bonding. In some embodiments, the interposer substrate 102 is bonded to the package substrate 120 through a reflow process, as previously discussed. The materials and formation method of the conductive elements 121 and the conductive structures 122 may be the same or similar to those of the conductive elements 107 and the conductive structures 108, respectively, illustrated in FIG. 1B, and are not repeated here. The conductive joints (i.e., conductive elements 121 and the conductive structures 122) enable electrical connection between the interposer substrate 102 (as well as devices thereon) and the package substrate 120. In some embodiments, an underfill element 118 is formed over the package substrate 120 to surround and protect the above conductive joints, and enhances the connection between the interposer substrate 102 and the package substrate 120, as shown in FIG. 1D. The materials and formation method of the underfill element 118 may be the same or similar to those of the underfill element 114 illustrated in FIG. 1B, and are not repeated here. The underfill element 118 exists but is not shown in FIG. 2.

Figure 1E:
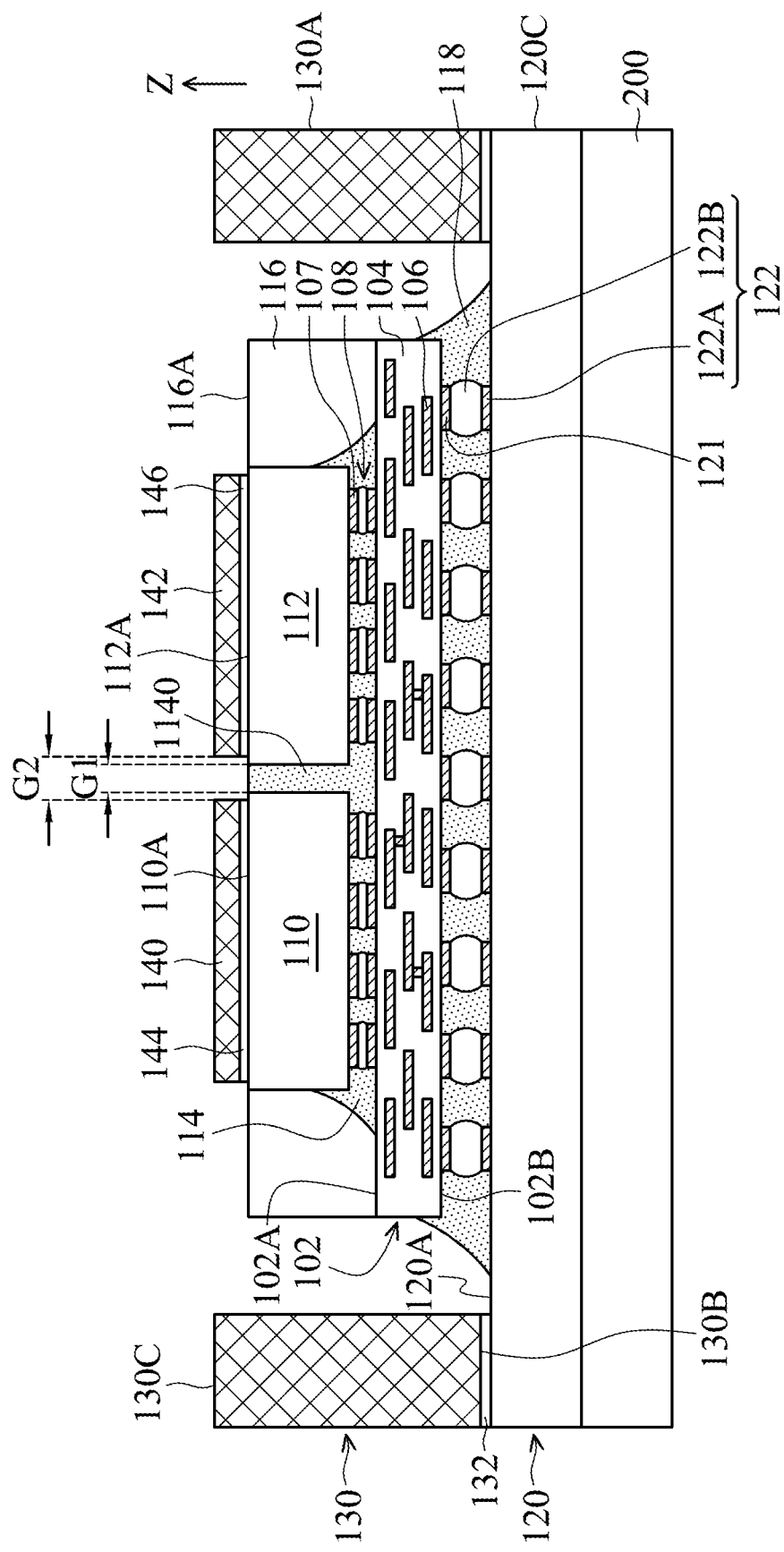
Figure 1F:
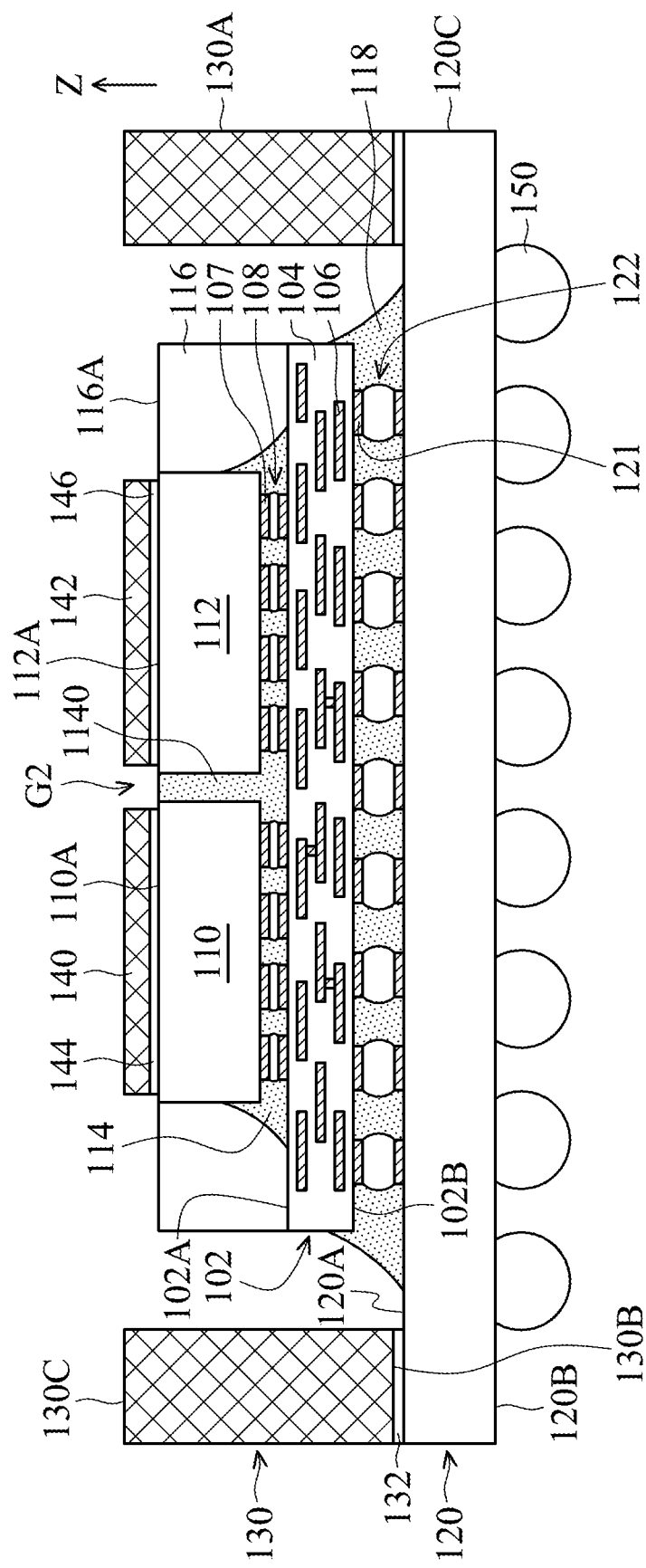
Figures 1, 1F:
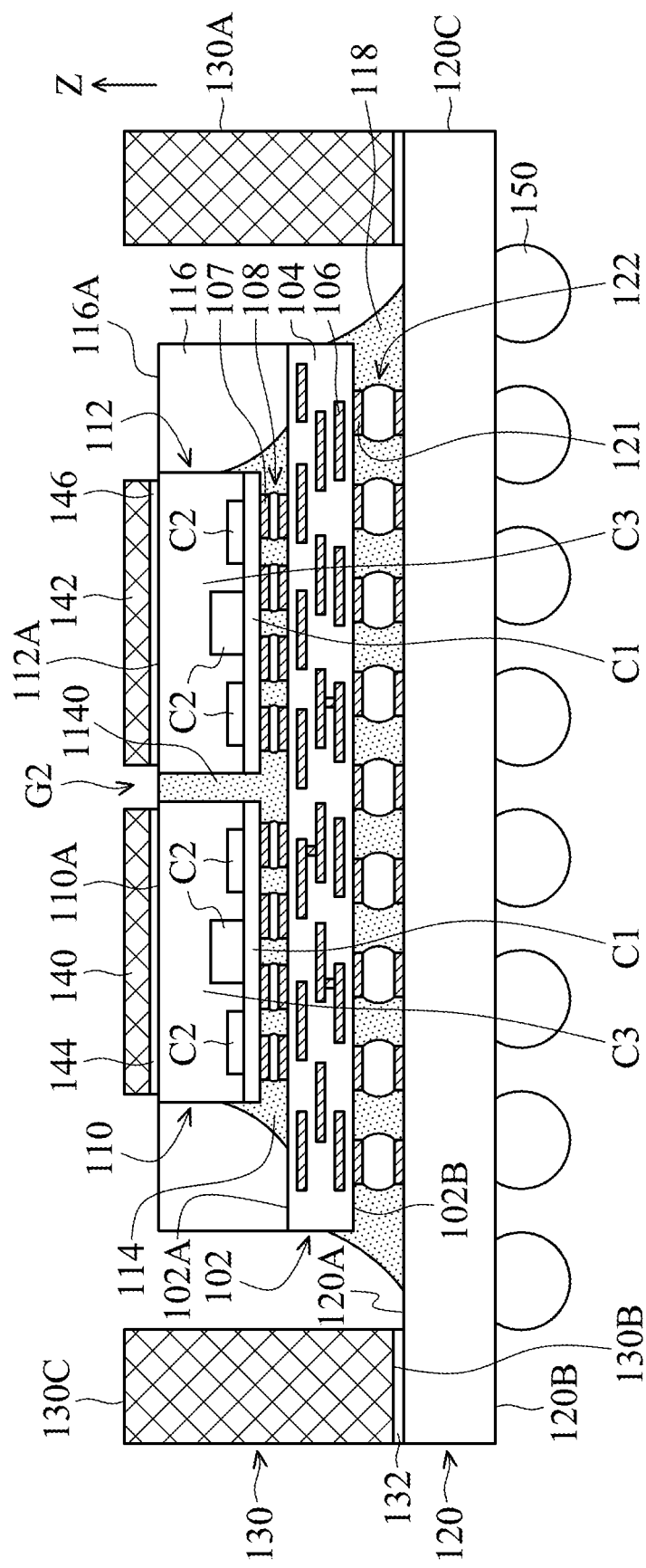

As shown in FIG. 1E, a ring structure 130 is installed on the package substrate 120, in accordance with some embodiments. The respective process is illustrated as process 404 in the process flow 400 shown in FIG. 4. In some embodiments, the process 404 is performed after the processes 401, 402 and 403 (i.e., after stacking the interposer substrate 102 along with the semiconductor dies 110 and 112 and the underfill element 114 over the package substrate 120). However, the disclosure is not limited thereto, and some alternative embodiments with different processing orders will be described later. During the process 404, the ring structure 130 may be placed over the package substrate 120 using, for example, a pick-and-place tool.

Figures 1, 1F, 2:
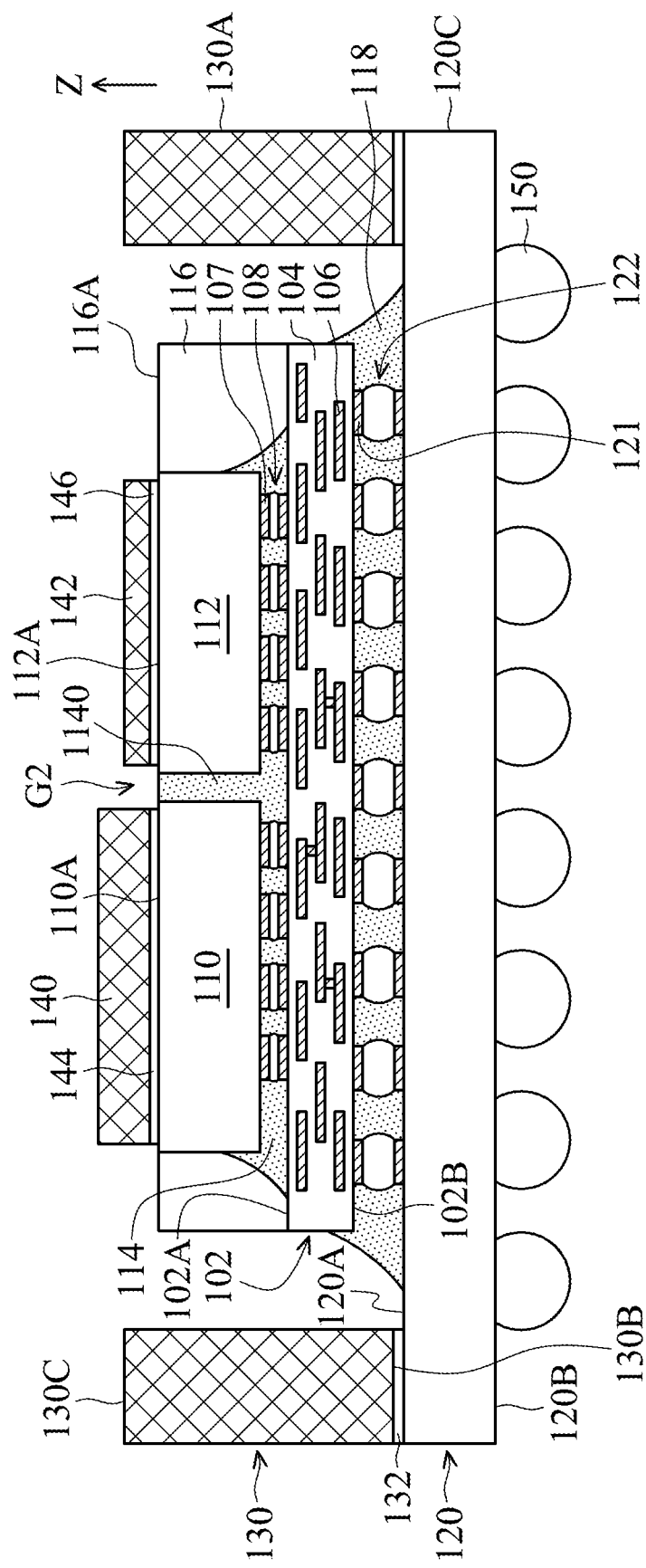
Figure 2:
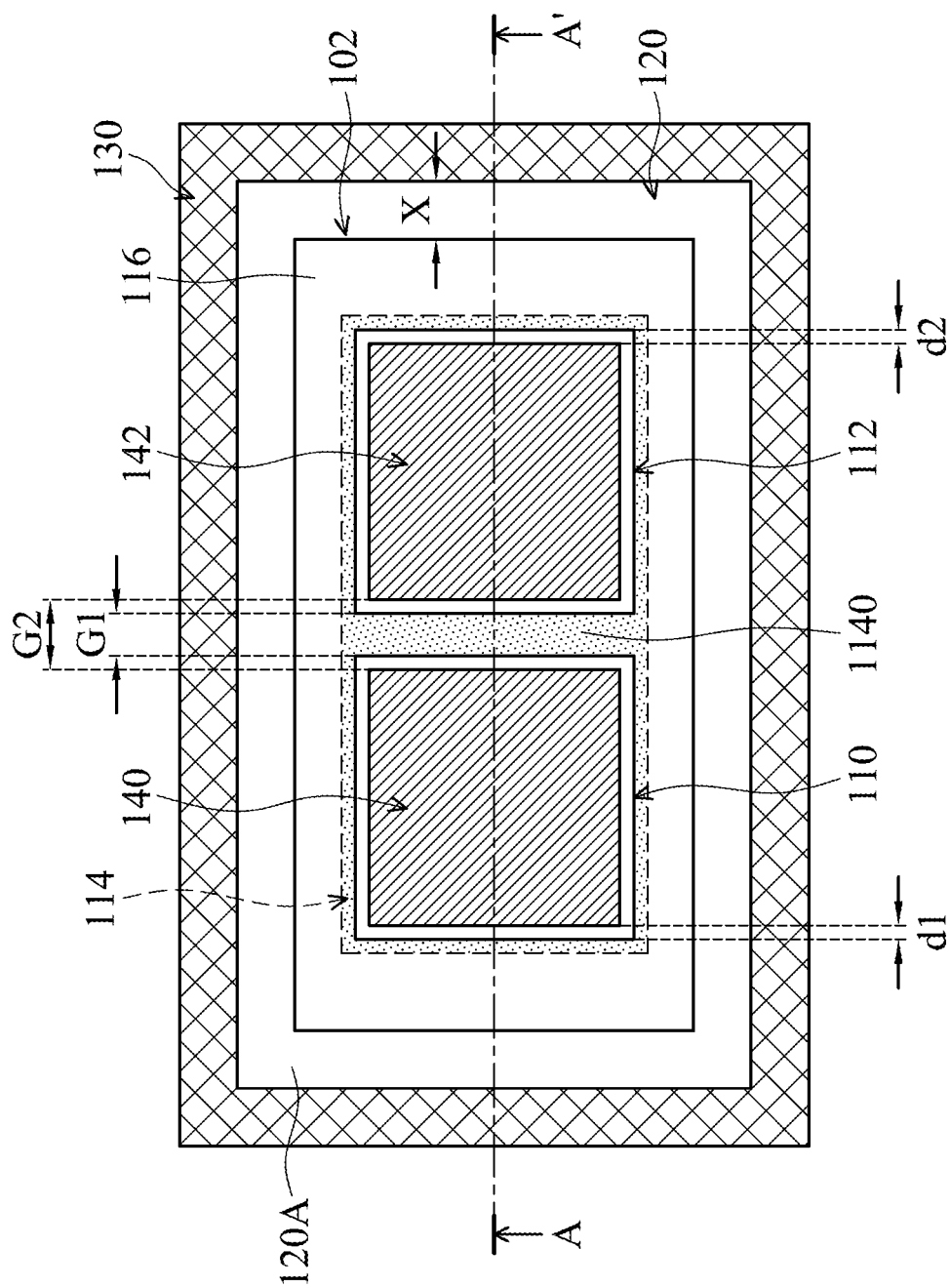

The ring structure 130 may have a rigidity greater than that of the package substrate 120, and may be configured as a stiffener ring for constraining the package substrate 120 to alleviate its warpage and/or to enhance robustness of the package substrate 120. In some embodiments, the ring structure 130 is mounted on the first surface 120A of the package substrate 120, and surrounds the interposer substrate 102 and the semiconductor dies 110 and 112 thereon. The ring structure 130 may have a substantially rectangular or square ring shape in top view (see FIG. 2), depending on the shape of the package substrate 120. In some embodiments, the ring structure 130 is arranged along the periphery of the package substrate 120 (for example, the outer edge 130A of the ring structure 130 is aligned with the periphery 120C of the package substrate 120, as shown in FIG. 1E), and a certain distance X is formed between the ring structure 130 and the interposer substrate 102 (as shown in FIG. 2). The ring structure 130 is basically a flat structure with a bottom surface 130B facing the first surface 120A and a top surface 130C opposite the bottom surface 130B.

The material of the ring structure 130 may include metal such as copper, stainless steel, stainless steel/Ni, or the like, but is not limited thereto. In some embodiments, the material of the ring structure 130 is selected so that the coefficient of thermal expansion (CTE) of the ring structure 130 is similar to that of the package substrate 120 to reduce CTE mismatch therebetween, thereby reducing stress (or deformation) on the package substrate 120 caused by the ring structure 130.

In some embodiments, as shown in FIG. 1E, the ring structure 130 is attached to the first surface 120A of the package substrate 120 using a non-conductive adhesive layer 132. The adhesive layer 132 may be any suitable adhesive, epoxy, die attach film (DAF), or the like. The adhesive layer 132 may be applied to the bottom surface 130B of the ring structure 130 or may be applied over the first surface 120A of the package substrate 120, in some embodiments.

In some other embodiments, the adhesive layer 132 is replaced by an attaching structure, which includes metal pillars with metal cap layers (sometimes referred to as micro bumps) that bond the ring structure 130 to the package substrate 120. The micro bumps may be formed on the bottom surface 130B of the ring structure 130, the first surface 120A of the package substrate 120, or both. In some embodiments, the micro bumps may be formed at the same time as the micro bumps (for example, the conductive structures 122) are formed on the package substrate 120. The micro bumps (such as the attaching structure) of the ring structure 130 can be reflowed together with the conductive structures 122, in some embodiments.

As shown in FIG. 1E, a lid structure 140 (also referred to a first lid structure) is further attached to the (first) semiconductor die 110 and another lid structure 142 (also referred to as second lid structure) is further attached to the (second) semiconductor die 112, in accordance with some embodiments. The respective process is illustrated as process 405 in the process flow 400 shown in FIG. 4. In some embodiments, the process 405 is also performed after the processes 401, 402 and 403 (i.e., after stacking the interposer substrate 102 with the semiconductor dies 110 and 112 and the underfill element 114 over the package substrate 120). The process 405 (of attaching the lid structures 140 and 142) and the process 404 (of installing the ring structure 130) may be performed simultaneously. In some other embodiments, the process 405 may be performed before or after the process 404. During the process 405, the lid structures 140 and 142 may be placed over the semiconductor dies 110 and 112, respectively, using, for example, a pick-and-place tool.

The lid structures 140 and 142 may have a high thermal conductivity, and may be configured as heat spreaders for dispersing heat generated from the semiconductor dies 110 and 112. Also, the lid structures 140 and 142 may have a rigidity greater than that of the semiconductor dies 110 and 112, and may be configured as stiffener lids for constraining the semiconductor dies 110 and 112 to alleviate their warpage and/or to enhance robustness of the semiconductor dies 110 and 112.

In some embodiments, the lid structures 140 and 142 are planar, and are disposed to cover at least a part of the top surface 110A of the semiconductor die 110 and at least a part of the top surface 112A of the semiconductor die 112, respectively. In some embodiments, the lid structures 140 and 142 have a substantially rectangular or square shape in top view, similar to or depending on the shape of the semiconductor dies 110 and 112, as shown in FIG. 2. Each lid structure 140 or 142 may be disposed at a position corresponding to a center region of the top surface 110A or 112A, but the disclosure is not limited thereto. In some embodiments, in order to avoid the influence of tolerances that inevitably occur between the lid structure 140 and the semiconductor die 110 and between the lid structure 142 and the semiconductor die 112, there is a certain distance d1 greater than 0 μm between each sidewall of the lid structure 140 and the corresponding sidewall of the semiconductor die 110, and there is a certain distance d2 greater than 0 μm between each sidewall of the lid structure 142 and the corresponding sidewall of the semiconductor die 112, as shown in FIG. 2. Each distance d1 or d2 may be about 150 μm to about 200 μm in some cases, but the disclosure is not limited thereto. Other values of the distances d1 and d2 can also be used.

In some alternative embodiments, the lid structure 140 substantially covers the entire top surface 110A, and the lid structure 142 covers the entire top surface 112A. In various embodiments, the coverage of the lid structure 140 over the top surface 110A is at least 70%, and the coverage of the lid structure 142 over the top surface 112A is at least 70%, in order to facilitate the heat dissipation of the semiconductor dies 110 and 112 through the lid structures 140 and 142.

In some embodiments as shown in FIG. 1F, the top surfaces of the lid structure 140, the lid structure 142, and the ring structure 130 may be co-planar or at the same level, but the top surfaces of the lid structure 140, the lid structure 142, and the ring structure 130 may be at different levels in different cases. In various embodiments, the lid structures 140 and 142 may have the same or different heights in a vertical direction (e.g., the direction Z shown in FIG. 1E), and/or the same or different sizes in a horizontal cross section perpendicular to the vertical direction, depending on the type or size of the semiconductor dies 110 and 112. For example, in the cases (see FIG. 1F-2) where the semiconductor die 110 has a larger size than the semiconductor die 112 and is therefore easier to bend, the lid structure 140 provided over the semiconductor die 110 may have a greater height (i.e., thickness) than the lid structure 142 provided over the semiconductor die 112 so as to suppress the bending of the semiconductor die 110.

The materials of the lid structures 140 and 142 may include metal such as copper, stainless steel, stainless steel/Ni, or the like, but is not limited thereto. In some embodiments, the materials of the lid structures 140 and 142 are selected so that CTEs of the lid structures 140 and 142 are similar to that of the semiconductor dies 110 and 112, respectively, to reduce CTE mismatch therebetween, thereby reducing stress (or deformation) on the semiconductor dies 110 and 112 caused by the lid structures 140 and 142. In some embodiments, the lid structures 140 and 142 are made of or include a different material than the ring structure 130. In some further embodiments, the lid structures 140 and 142 are made of or include different materials in cases where the semiconductor dies 110 and 112 have different CTEs. In some other embodiments, the ring structure 130 and the lid structures 140 and 142 are made of or include the same material, such as a metal material (e.g., copper).

In some embodiments, as shown in FIG. 1E, the (first) lid structure 140 is attached to the top surface 110A of the (first)

semiconductor die 110 using a thermal interface material (TIM) layer 144, and the (second) lid structure 142 is attached to the top surface 112A of the (second) semiconductor die 112 using a thermal interface material layer 146. The thermal interface material layers 144 and 146 each may be a thermally conductive and electrically insulative material, such as an epoxy, an epoxy mixed with a metal like silver or gold, a thermal grease, the like, or a combination thereof.

In the present embodiment, as shown FIGS. 1E and 2, the lid structures 140 and 142 are separated and disposed over the semiconductor dies 110 and 112, respectively. Therefore, a gap G2 can be formed between the adjacent lid structures 140 and 142, and located over the portion 1140 of the underfill element 114 between the adjacent semiconductor dies 110 and 112. The gap G2 may be greater than or equal to the gap G1, in some cases. Accordingly, the portion 1140 of the underfill element 114 between the adjacent semiconductor dies 110 and 112 is exposed through the gap G2, thereby avoiding or reducing stress on that portion 1140 (compared with a package structure having a single continuous lid that extends across and covers a portion of the underfill element between the adjacent semiconductor dies, leading to stress concentrated on that portion of the underfill element). Therefore, the risk of cracks or delamination on the portion 1140 of the underfill element 140 between adjacent semiconductor dies 110 and 112 is also reduced, and the entire semiconductor die package can be used more reliably.

As shown in FIG. 1F, the carrier substrate 200 (in FIG. 1E) is removed to expose a second surface 120B (for example, the lower surface) of the package substrate 120, after the attachment of the separate ring structure 130 and the lid structures 140 and 142, in accordance with some embodiments. Conductive bumps 150 are then formed over the second surface 120B that is originally covered by the carrier substrate 200. Each conductive bump 50 may be electrically connected to one of the exposed contact pads (not shown) of the package substrate 120. The conductive bumps 50 enable electrical connection between the package structure and an external electronic device such as a PCB (not shown). The conductive bumps 50 may be or include solder bumps such as tin-containing solder bumps. The tin-containing solder bumps may further include copper, silver, gold, aluminum, lead, one or more other suitable materials, or a combination thereof. In some embodiments, the tin-containing solder bump is lead-free.

In some embodiments, solder balls (or solder elements) are disposed on the exposed contact pads of the second surface 120B after the removal of the carrier substrate 200. A reflow process is then carried out to melt the solder balls into the conductive bumps 150. In some other embodiments, under bump metallization (UBM) elements are formed over the exposed contact pads before the solder balls are disposed. In some other embodiments, solder elements are electroplated onto the exposed contact pads. Afterwards, a reflow process is used to melt the solder element to form the conductive bumps 150.

As a result, the process for forming the resulting semiconductor die package structure illustrated in FIG. 1F is completed. In the package structure in FIG. 1F, multi-lid (also called discontinuous lid) structures including the separate lid structures 140 and 142 and the ring structure 130 (surrounding the lid structures 140 and 142) are coupled to the package substrate 120 and the semiconductor dies 110 and 112, respectively, without covering the portion 1140 of the underfill element 114 between the adjacent semiconductor dies 110 and 112. Accordingly, the warpage on the package substrate 120 and the semiconductor dies 110 and 112 is reduced, and the stress concentration on the portion 1140 of the underfill element 114 between the adjacent semiconductor dies 110 and 112 is also reduced. Consequently, the reliability of the entire package structure is improved.

Many variations and/or modifications can be made to embodiments of the disclosure. For example, FIGS. 3A to 3C are schematic plan views showing the lid structures each including a plurality of lid parts in accordance with some other embodiments. In FIG. 3A, the (first) lid structure 140 includes two separate rectangular lid parts 1400 of the same size, and each lid part 1400 covers approximately half of the (first) semiconductor die 110. Similarly, the (second) lid structure 142 includes two separate rectangular lid parts 1420 of the same size, and each lid part 1420 covers approximately half of the (second) semiconductor die 112. In FIG. 3B, the (first) lid structure 140 includes four separate square lid parts 1400 of the same size, and each lid part 1400 covers approximately a quarter of the (first) semiconductor die 110. Similarly, the (second) lid structure 142 includes four separate square lid parts 1420 of the same size, and each lid part 1420 covers approximately a quarter of the (second) semiconductor die 112. In FIG. 3C, the (first) lid structure 140 includes four separate rectangular lid parts 1400 of the same size, and each lid part 1400 is arranged so that its long-axis is parallel to one adjacent side of the (first) semiconductor die 110. Similarly, the(second) lid structure 142 includes four separate rectangular lid parts 1420 of the same size, and each lid part 1420 is arranged so that its long-axis is parallel to one adjacent side of the (second) semiconductor die 112. One of ordinary skill in the art would appreciate that the above lid structures (or parts) examples are provided for illustrative purposes, and other structures or configurations of the lid structures (or parts) may also be used.

Figure 5:
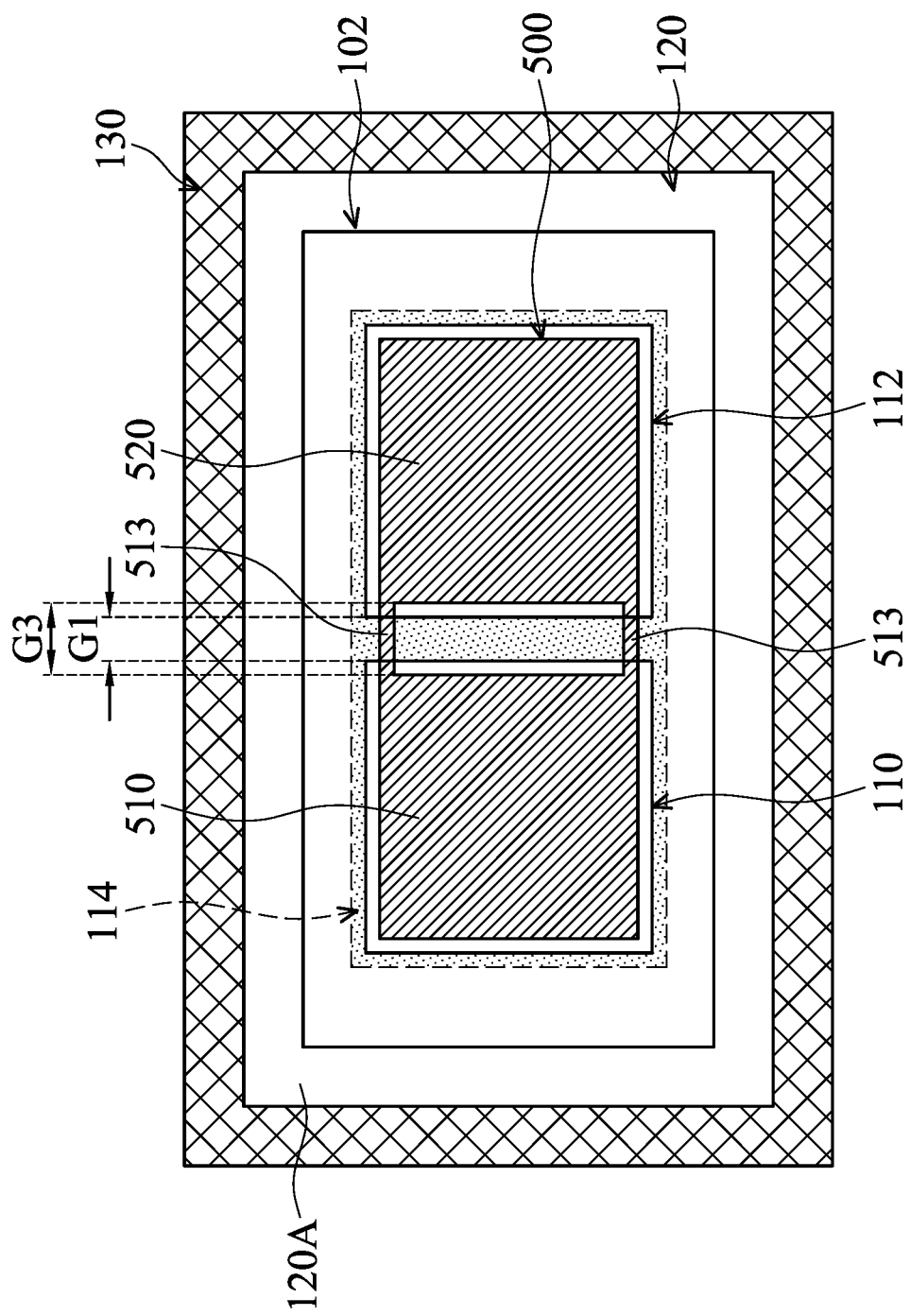
FIG. 5 is a schematic plan view of a semiconductor die package in accordance with some embodiments.

FIG. 5 is a schematic plan view of a semiconductor die package in accordance with some other embodiments. The semiconductor die package in FIG. 5 is similar to the semiconductor die package in FIG. 2, except that a single lid structure 500 is used instead of separate lid structures 140 and 142 in FIG. 2. Using a single lid structure 500 has the advantage of reducing processing time such as the time for placing the lid structure 500 over the semiconductor dies 110 and 112. The semiconductor die package in FIG. 5 can also be formed by the process flow 400 in FIG. 4.

In some embodiments, as shown in FIG. 5, the lid structure 500 includes a first lid part 510 and a second lid part 520. The first lid part 510 and the second lid part 520 are configured to be attached to the top surface 110A of the semiconductor die 110 and the top surface 112A of the semiconductor die 112, respectively, to facilitate heat dissipation and warpage control. The materials, structure, configuration, and attaching method of the first lid part 510 and the second lid part 520 are similar to the lid structures 140 and 142 previously discussed in FIG. 2, and are not repeated here. A gap G3 (similar to the gap G2 shown in FIG. 2) is also formed between the first lid part 510 and the second lid part 520 to expose the underlying portion 1140 of the underfill element 114 between the adjacent semiconductor dies 110 and 112, thereby avoiding or reducing stress on that portion 1140. In some embodiments, the lid structure 500 further includes one or more connecting parts 513 (such as two connecting parts 513, as shown in FIG. 5) to partially connect the first lid part 510 and the second lid part 520 into one piece. Although the connecting parts 513 may extend across the portion 1140 of the underfill element 114, they only cover a relatively small part of the portion 1140 (i.e., most of the portion 1140 is still exposed through the gap G3). Therefore, the lid structure 500 also helps to reduce stress concentration, as well as the risk of cracks or delamination, on the portion 1140 by exposing it through the gap G3 (compared with a case of using a continuous, solid lid that extends across and completely covers the portion of the underfill element between the adjacent semiconductor dies).

Figure 6:
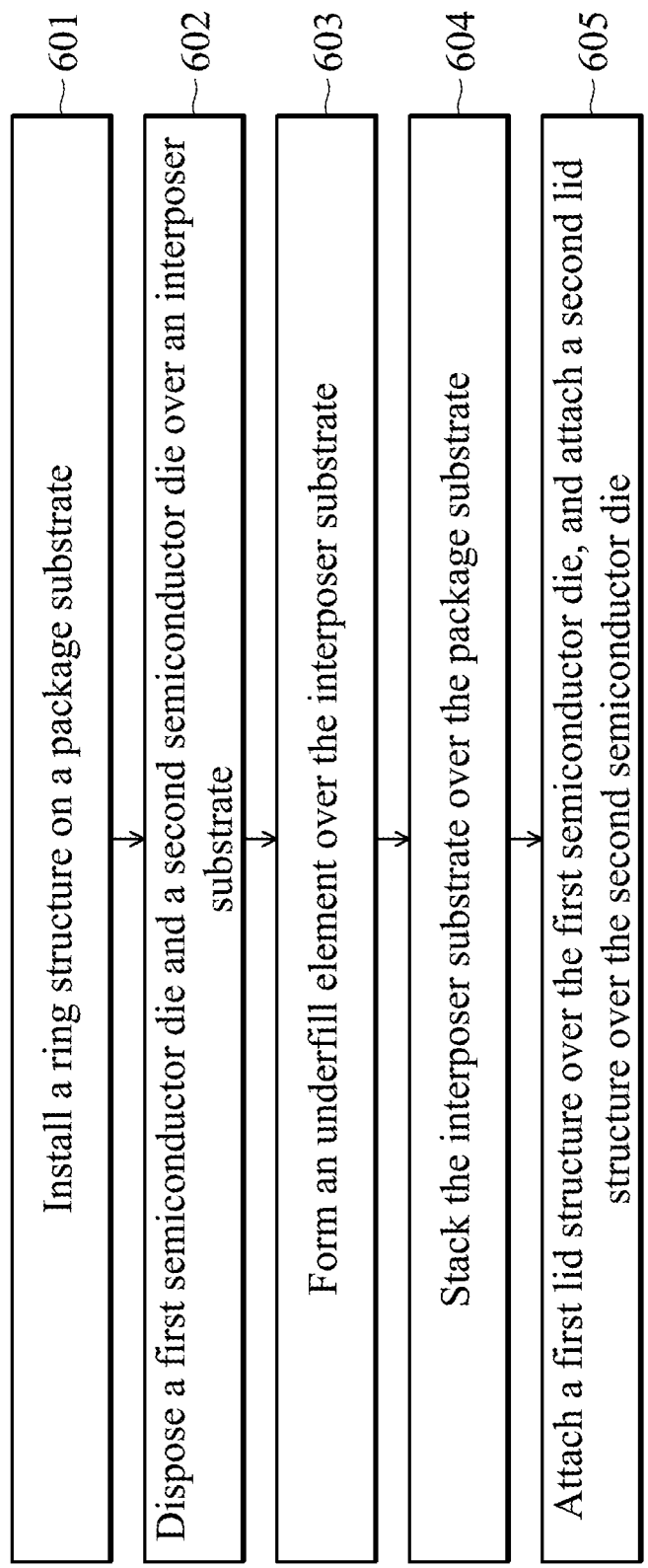
FIG. 6 illustrates a process flow for forming a semiconductor die package in accordance with some embodiments.

FIG. 6 illustrates a process flow 600 for forming a semiconductor die package in accordance with some other embodiments, which includes process 601: install a ring structure on a package substrate; process 602: dispose a first semiconductor die and a second semiconductor die over an interposer substrate; process 603: form an underfill element over the interposer substrate; process 604: stack the interposer substrate over the package substrate; and process 605: attach a first lid structure over the first semiconductor die and attach a second lid structure over the second semiconductor die. The details of the processes 601, 602, 603, 604, and 605 may be the same or similar to those of the processes 404, 401, 402, 403, and 405 of the process flow 400 illustrated in FIG. 4 and therefore not repeated here. The process flow 600 differs from the process flow 400 only in that the process 601 (of installing the ring structure) is performed before the processes 602, 603 and 604 (i.e., before stacking the interposer substrate 102 with the semiconductor dies 110 and 112 and the underfill element 114 over the package substrate 120). The process flow 600 can also be used to form the various semiconductor die packages described above.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the disclosure form a semiconductor die package including a package substrate, an interposer substrate over the package substrate, several semiconductor dies over the interposer substrate, and an underfill element over the interposer substrate and between the semiconductor dies and the interposer substrate. The semiconductor die package also includes multi-lid structures that include a ring structure and one or more lid structures separated from the ring structure, in accordance with some embodiments. The ring structure is coupled to the package substrate to control warpage. The lid structures are coupled to the top surfaces of the semiconductor dies to control warpage and help heat dissipation. In addition, the lid structures define a gap to allow a portion of the underfill element between the adjacent semiconductor dies to be exposed, so that stress concentration on that portion can be avoided or reduced. Accordingly, the reliability of the semiconductor die package is improved.

In accordance with some embodiments, a semiconductor die package is provided. The semiconductor die package includes a package substrate, an interposer substrate, a first semiconductor die, a second semiconductor die, an underfill element, a ring structure, a first lid structure, and a second lid structure. The package substrate has a first surface. The interposer substrate is disposed over the first surface. The first semiconductor die and the second semiconductor die are disposed over the interposer substrate. The underfill element is disposed over the interposer substrate and surrounds the first and second semiconductor dies. A portion of the underfill element is between the first semiconductor die and the second semiconductor die. The ring structure is attached to the first surface of the package substrate and arranged along the periphery of the package substrate. The first lid structure is attached to the first top surface of the first semiconductor die. The second lid structure is attached to the second top surface of the second semiconductor die, and separated from the first lid structure. A gap is formed between the first lid structure and the second lid structure and located over the portion of the underfill element.

In accordance with some embodiments, a semiconductor die package is provided. The semiconductor die package includes a package substrate, an interposer substrate, a first semiconductor die, a second semiconductor die, an underfill element, a ring structure, and a lid structure. The package substrate has a first surface. The interposer substrate is disposed over the first surface. The first semiconductor die and the second semiconductor die are disposed over the interposer substrate. The underfill element is disposed over the interposer substrate and surrounds the first and second semiconductor dies. A portion of the underfill element is between the first semiconductor die and the second semiconductor die. The ring structure is attached to the first surface of the package substrate and arranged along the periphery of the package substrate. The lid structure includes a first lid part and a second lid part. The first lid part covers a first top surface of the first semiconductor die. The second lid part covers a second top surface of the second semiconductor die. A gap is formed between the first lid part and the second lid part to expose the portion of the underfill element.

In accordance with some embodiments, a method for forming a semiconductor die package is provided. The method includes disposing a first semiconductor die and a second semiconductor die over an interposer substrate. The method also includes forming an underfill element over the interposer substrate to surround the first and second semiconductor dies. A portion of the underfill element is between the first semiconductor die and the second semiconductor die. The method also includes stacking the interposer substrate along with the first and second semiconductor dies and the underfill element over a package substrate. The method further includes installing a ring structure on the package substrate and along the periphery of the package substrate. In addition, the method includes attaching a first lid structure to a first top surface of the first semiconductor die and attaching a second lid structure to a second top surface of the second semiconductor die. A gap is formed between the first lid structure and the second lid structure to expose the portion of the underfill element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die package, comprising:
a package substrate having a first surface;
an interposer substrate disposed over the first surface;
a first semiconductor die and a second semiconductor die disposed over the interposer substrate;
an underfill element disposed over the interposer substrate and surrounding the first and second semiconductor dies, wherein a portion of the underfill element is between the first semiconductor die and the second semiconductor die;
a ring structure attached to the first surface of the package substrate and arranged along a periphery of the package substrate;
a first lid structure attached to a first top surface of the first semiconductor die, wherein in plan view, the entire first lid structure is located within a periphery of the first top surface of the first semiconductor die; and
a second lid structure attached to a second top surface of the second semiconductor die, wherein in plan view, the entire second lid structure is located within a periphery of the second top surface of the second semiconductor die, wherein the second lid structure is separated from the first lid structure, and a gap is formed between the first lid structure and the second lid structure and located over the portion of the underfill element.

2. The semiconductor die package as claimed in claim 1, wherein the portion of the underfill element is exposed through the gap.

3. The semiconductor die package as claimed in claim 1, wherein the ring structure surrounds the interposer substrate, the first and second semiconductor dies, the first lid structure, and the second lid structure, and the ring structure is separated and disconnected from the first and second lid structures.

4. The semiconductor die package as claimed in claim 1, wherein the first and second lid structures and the ring structure comprise a metal material.

5. The semiconductor die package as claimed in claim 1, further comprising a second underfill element disposed between the interposer substrate and the package substrate, and the second underfill element is separated from the ring structure.

6. The semiconductor die package as claimed in claim 1, wherein the first lid structure covers a part of the first top surface of the first semiconductor die, and the second lid structure covers a part of the second top surface of the second semiconductor die.

7. The semiconductor die package as claimed in claim 1, wherein there is a distance greater than 0 μm between a sidewall of the first lid structure and a corresponding sidewall of the first semiconductor die, and there is a distance greater than 0 μm between a sidewall of the second lid structure and a corresponding sidewall of the second semiconductor die.

8. The semiconductor die package as claimed in claim 1, wherein at least one of the first lid structure or the second lid structure includes a plurality of lid parts separated from each other.

9. The semiconductor die package as claimed in claim 1, wherein the first and second lid structures are attached to the first and second semiconductor dies through a thermal interface material (TIM) layer, and the ring structure is attached to the package substrate through an adhesive layer.

10. The semiconductor die package as claimed in claim 1, further comprising an encapsulant layer disposed over the interposer substrate and surrounding the first and second semiconductor dies and the underfill element, wherein the first top surface of the first semiconductor die and the second top surface of the second semiconductor die are exposed from the encapsulant layer, and wherein the encapsulant layer is separated from the ring structure.

11. A semiconductor die package, comprising:
a package substrate having a first surface;
an interposer substrate disposed over the first surface;
a first semiconductor die and a second semiconductor die disposed over the interposer substrate;
an underfill element disposed over the interposer substrate and surrounding the first and second semiconductor dies, wherein a portion of the underfill element is between the first semiconductor die and the second semiconductor die;
a ring structure attached to the first surface of the package substrate and arranged along a periphery of the package substrate; and
a lid structure including a first lid part and a second lid part, wherein the first lid part covers a first top surface of the first semiconductor die, the second lid part covers a second top surface of the second semiconductor die, and a gap is formed between the first lid part and the second lid part to expose the portion of the underfill element, wherein in plan view, the entire first lid part is located within a periphery of the first top surface of the first semiconductor die, and the entire second lid part is located within a periphery of the second top surface of the second semiconductor die.

12. The semiconductor die package as claimed in claim 11, wherein the lid structure further includes a connecting part extending across the portion of the underfill element to partially connect the first lid part and the second lid part.

13. The semiconductor die package as claimed in claim 11, wherein the ring structure surrounds the interposer substrate, the first and second semiconductor dies, and the lid structure, and the ring structure is separated and disconnected from the lid structure.

14. The semiconductor die package as claimed in claim 11, wherein a coefficient of thermal expansion (CTE) of the lid structure is similar to that of the first and second semiconductor dies, and a CTE of the ring structure is similar to that of the package substrate.

15. The semiconductor die package as claimed in claim 11, wherein a coverage of the first lid part over the first top surface is at least 70%, and a coverage of the second lid part over the second top surface is at least 70%.

16. A method for forming a semiconductor die package, comprising:
disposing a first semiconductor die and a second semiconductor die over an interposer substrate;
forming an underfill element over the interposer substrate to surround the first and second semiconductor dies, wherein a portion of the underfill element is between the first semiconductor die and the second semiconductor die;
stacking the interposer substrate along with the first and second semiconductor dies and the underfill element over a package substrate;
installing a ring structure on the package substrate and along a periphery of the package substrate; and attaching a first lid structure to a first top surface of the first semiconductor die and attaching a second lid structure to a second top surface of the second semiconductor die, wherein a gap is formed between the first lid structure and the second lid structure to expose the portion of the underfill element, wherein in plan view, the entire first lid structure is located within a periphery of the first top surface of the first semiconductor die, and the entire second lid structure is located within a periphery of the second top surface of the second semiconductor die.

17. The method as claimed in claim 16, wherein the attachment of the first and second lid structures is performed after stacking the interposer substrate along with the first and second semiconductor dies and the underfill element over the package substrate.

18. The method as claimed in claim 17, wherein the attachment of the first and second lid structures and the installation of the ring structure are performed simultaneously.

19. The method as claimed in claim 16, wherein the ring structure is installed before stacking the interposer substrate along with the first and second semiconductor dies and the underfill element over the package substrate.

20. The method as claimed in claim 16, wherein the ring structure, the first lid structure, and the second lid structure are separated and disconnected.

* * * * *